US008453593B1

(12) United States Patent
Weisenberg

(10) Patent No.: US 8,453,593 B1
(45) Date of Patent: Jun. 4, 2013

(54) EMISSION ATTENUATED LINING APPARATUS AND METHODS FOR STRUCTURES

(76) Inventor: Kent Weisenberg, Englewood, FL (US)

( * ) Notice: Subject to any disclaimer, the term of this patent is extended or adjusted under 35 U.S.C. 154(b) by 0 days.

(21) Appl. No.: 13/592,140

(22) Filed: Aug. 22, 2012

(51) Int. Cl.
*C23C 14/00* (2006.01)
*B05B 3/00* (2006.01)

(52) U.S. Cl.
USPC .......... 118/50; 239/722

(58) Field of Classification Search
None
See application file for complete search history.

(56) References Cited

U.S. PATENT DOCUMENTS

| | | | | |
|---|---|---|---|---|
| 3,135,629 | A | 6/1964 | McLean | |
| 3,916,568 | A | 11/1975 | Rose | |
| 4,036,437 | A | 7/1977 | Dreher | |
| 4,704,986 | A * | 11/1987 | Remp et al. | 118/318 |
| 5,520,734 | A * | 5/1996 | Taylor et al. | 118/307 |
| 5,695,389 | A | 12/1997 | Bartel | |
| 5,730,646 | A | 3/1998 | Watkin | |
| 5,765,754 | A * | 6/1998 | Emilsson | 239/120 |
| 5,904,612 | A | 5/1999 | Urakami | |
| 6,789,553 | B2 | 9/2004 | Harris | |
| 7,331,846 | B1 * | 2/2008 | Shimizu et al. | 451/92 |
| 7,867,558 | B1 | 1/2011 | Weisenberg | |
| 2005/0013930 | A1 | 1/2005 | Killmer, Sr. | |
| 2011/0097486 | A1 | 4/2011 | Weisenberg | |
| 2011/0244125 | A1 | 10/2011 | Weisenberg | |

* cited by examiner

*Primary Examiner* — Dah-Wei Yuan
*Assistant Examiner* — Charles Capozzi
(74) *Attorney, Agent, or Firm* — David McEwing

(57) ABSTRACT

The invention provides an improved method and robotic apparatus for preparing and applying a structural member while significantly mitigating hazardous emissions. The remotely controlled robot comprised a series of expandable and interchangeable chambers that allow of site-specific customization. The chambers are linked together by means of flexible interface that allow for the apparatus to conform to the tank radius. A set of synchronized steerable tractor drives are at each end of the apparatus and provide motion across the surface. The chambers have a flexible vacuum seal for the mitigation of harmful emissions. A detachable umbilical with product delivery lines, pneumatic lines, electrical power and signal and video lines contained within remains attached to the robot during the lining operation. The system is suspended from the surface by means of a support structure and center trunnion.

16 Claims, 18 Drawing Sheets

EMISSION ATTENUATED LINING APPARATUS AND METHODS FOR STRUCTURES

1. FIELD OF USE

This disclosure pertains to an apparatus and method for lining structures. For example the apparatus can be used to line the side surfaces of vertically oriented cylindrical shaped tanks and water towers.

2. BACKGROUND OF INVENTION

Lining or coating of tank walls or other surfaces has typically been conducted by individuals operating hand controlled blasting devices, sprayers or rollers. Individuals obtain access the tank walls by elaborate scaffolding or hydraulic power bucket devices.

SUMMARY OF INVENTION

The invention provides an improved method and robotic apparatus for preparing and applying a structural member on curved tank surfaces or other structures while significantly mitigating hazardous emissions. The invention provides a method for allowing for an 'all inclusive' climate controlled lining method in a one step process which eliminates the potential for flash rusting, surface contamination, recoat windows, weather events, temperature events and other long and short term adhesion impeding factors of current coating methods. The invention provides a method for assuring human safety by mitigating the need to work from tank tops, elevated platforms and from the exposure to harmful airborne contaminants. The lining becomes a structural member of the tank by increasing the strength, resistance to corrosion and erosion resistance and or insulating properties of the tank wall. Hazardous emissions can arise from removal of the old tank lining material and from airborne heavy metals in blasting processes.

The remotely controlled robot comprised a series of expandable and interchangeable chambers that allow for site-specific customization. The chambers are linked together by means of flexible, pivotable interfaces that allow for the apparatus to conform to the tank radius. A set of synchronized steerable tractor drives are at each end of the apparatus and provide horizontal motion across the vertical surface. The chambers have a flexible vacuum seal for the collection and mitigation of harmful emissions. A detachable umbilical with product delivery lines, pneumatic lines, electrical power and signal and video lines contained within remains attached to the robot during the lining operation.

The system is suspended from the surface by means of a support structure and center trunnion during vertical applications.

The invention provides for a series of interchangeable chambers, each designed to perform a separate task. The first chamber in series contains a unit that removes the wall contaminates by means of a pliant abrasive blast media. The media and encapsulated contaminates are removed by a recirculating vacuum system including a vacuum seal. The second chamber removes the residual dust by means of compressed air blow down and a vacuum system including a vacuum seal. The third chamber applies a pressurized misting of direct to surface (DTS) of a soluble salt mitigation compound with any excess removed by a vacuum system. The fourth chamber rinses away soluble salt mitigation compound with medium pressure potable water and affords additional cleaning of blast profile previously created in the substrate. The water and contaminates are removed by means of a vacuum system. The fifth chamber provides for high-pressure processed air for the removal of residual moisture with a vacuum system to capture contaminates. The final chamber contains an apparatus and method that allows spraying of an isocyanate and amine resin mixture or other mixtures onto the prepared surface by means of an orbiting spray head. The orbiting spray head provides for consistent coverage and thickness and facilitates angled trajectory for consistent coverage on weld seams, concaves, convexes and other existing substrate irregularities. The final chamber is fitted with adjustable roller components that allow the position or height of the chamber to be adjusted relative to the structure surface. This can be termed a position adjustable spray chamber.

SUMMARY OF DRAWINGS

The accompanying drawings, which are incorporated in and constitute a part of the specification, illustrate preferred embodiments of the invention. These drawings, together with the general description of the invention given above and the detailed description of the preferred embodiments given below, serve to explain the principles of the invention.

DETAILED DESCRIPTION OF DISCLOSURE

The apparatus subject of the disclosure can traverse a flat or curved surface. The apparatus is comprised of a plurality and variable segmented chambers. The chambers may each include a vacuum system. The vacuum system can exhaust to a support container or vehicle. The vacuum system can be re-circulating.

The chambers may be pivotably attached or linked together. This facilitates the robot traversing over surface irregularities. The chambers may have guide wheels that can control the contact or communication of chamber vacuum seal and the structure surface i.e., position adjustable chambers.

Further, the chambers can include an oscillating spray nozzle or suction or exhaust port. The nozzle or port oscillates laterally within the chamber. If the apparatus is oriented vertically and traversing horizontally along the side wall of a structure, the nozzles or suction ports oscillate vertically. If the apparatus is oriented horizontally, such as traversing a floor of a structure, the nozzles or suction ports oscillate horizontally.

The apparatus also includes an umbilical. Included in the umbilical can be electrical power, signal lines, cctv output cables, separate lines conveying a two part coating, water, compressed air and soluble salt compound. In parallel with the umbilical can be one or more re-circulating vacuum exhaust lines.

Figure 1:
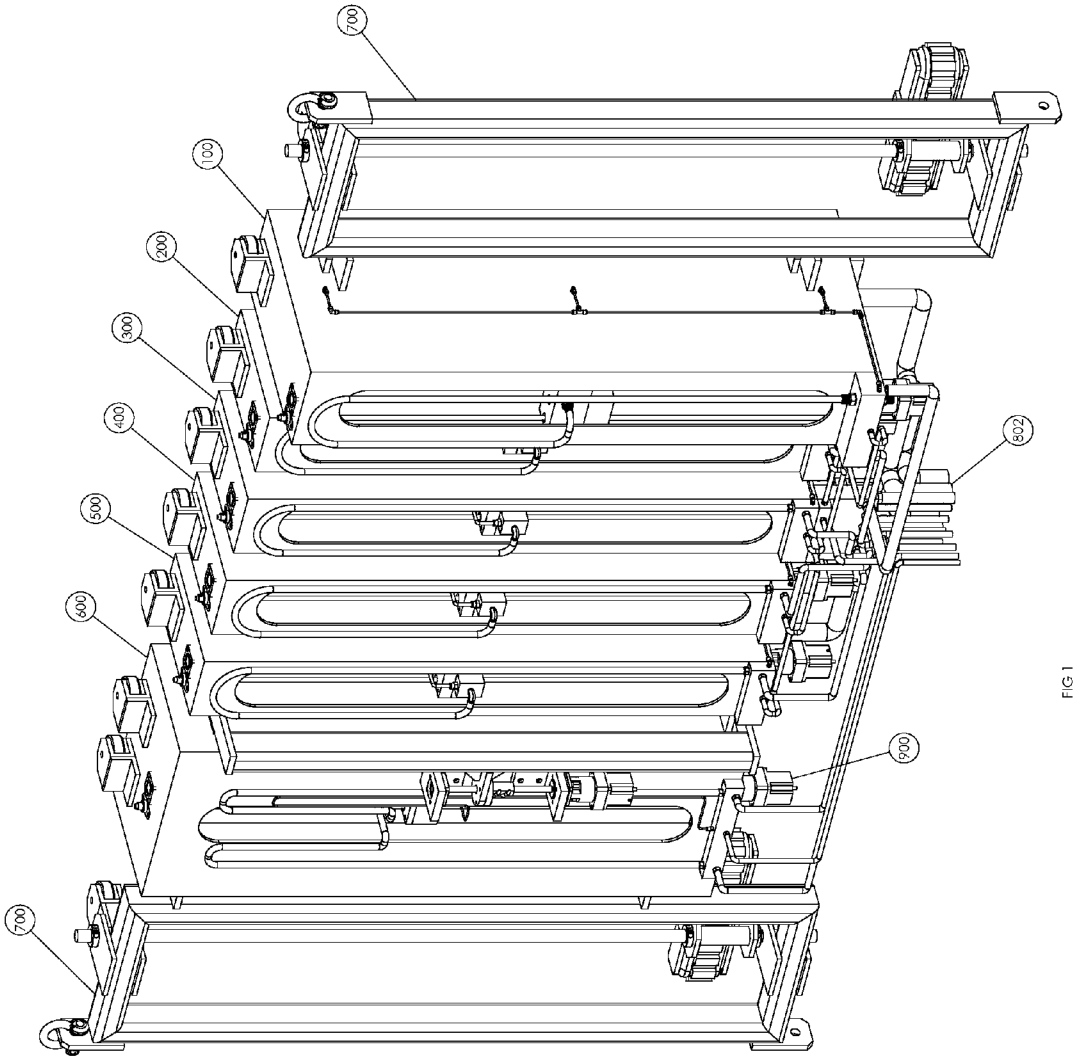
FIG. 1 is a perspective view on multiple chambers of the Emission Attenuated Lining Apparatus subject of the disclosure including the end steering and propulsion units.

FIG. 1 illustrates a prospective view of one embodiment of the disclosure. For reference, the end of the apparatus robot (hereafter known as "robot") 100, and the pliant abrasive blast media chamber will be referenced as the front of the robot and the opposite end 600, the coating chamber will be referenced as the rear of the robot.

Figure 5:
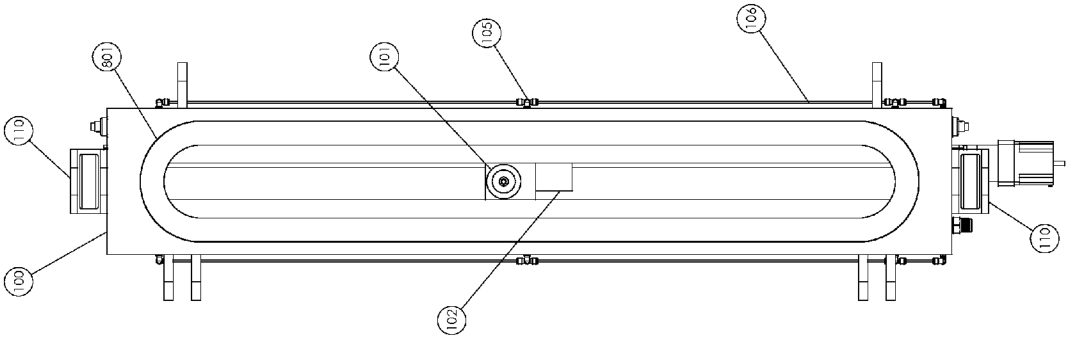
FIG. 5 is a bottom view of the chamber.
Figure 4:
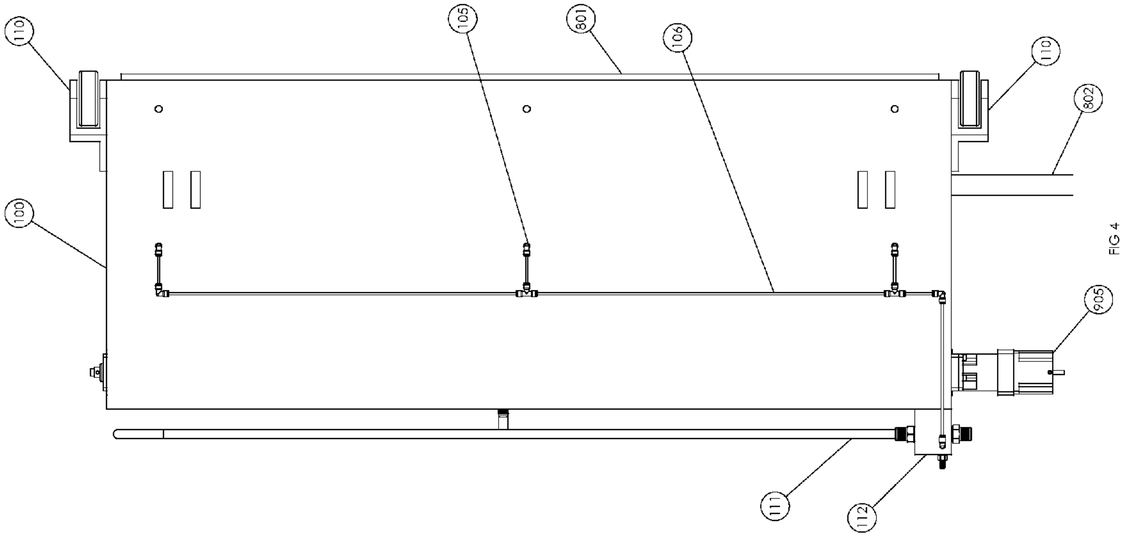
FIG. 4 is a side view of the chamber.
Figure 3:
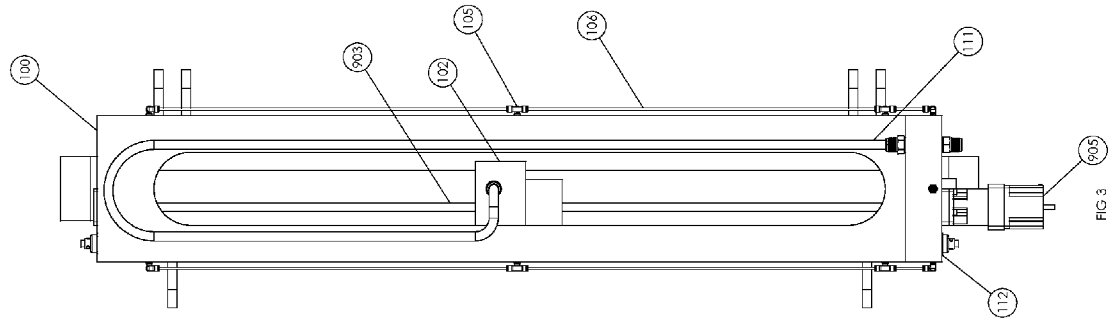
FIG. 3 is a top view of the abrasive blast media chamber of the robot subject of this disclosure.

FIG. 3 illustrates a top view of the front of the robot, the pliant abrasive blast media chamber 100. The blast nozzle 101 is mounted on a manifold block 102 which passes through a linear screw drive assembly 903 The pliant abrasive blast media chamber 100 conforms to the tank wall by means of a flexible vacuum seal 801 (shown on FIGS. 4 & 5) to capture harmful emissions from escape. Pliant abrasive blast media and dislodged contaminates are captured by means of a re-circulating vacuum system return line 802 (shown on FIGS. 1 & 4).

Figure 10:
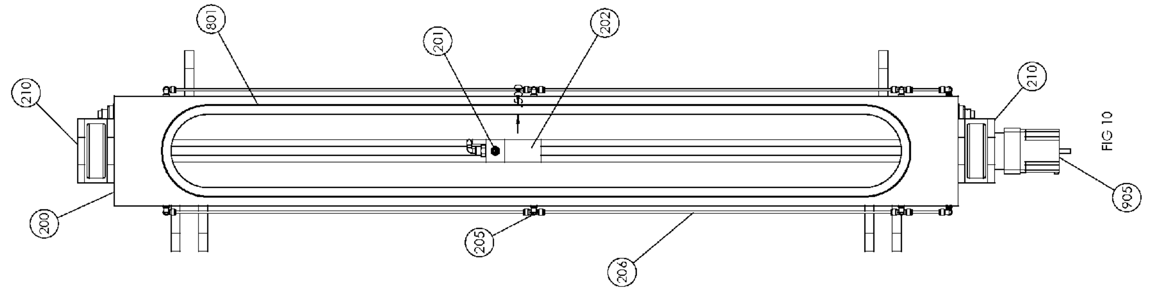
FIG. 10 is a bottom view of the chamber.
Figure 9:
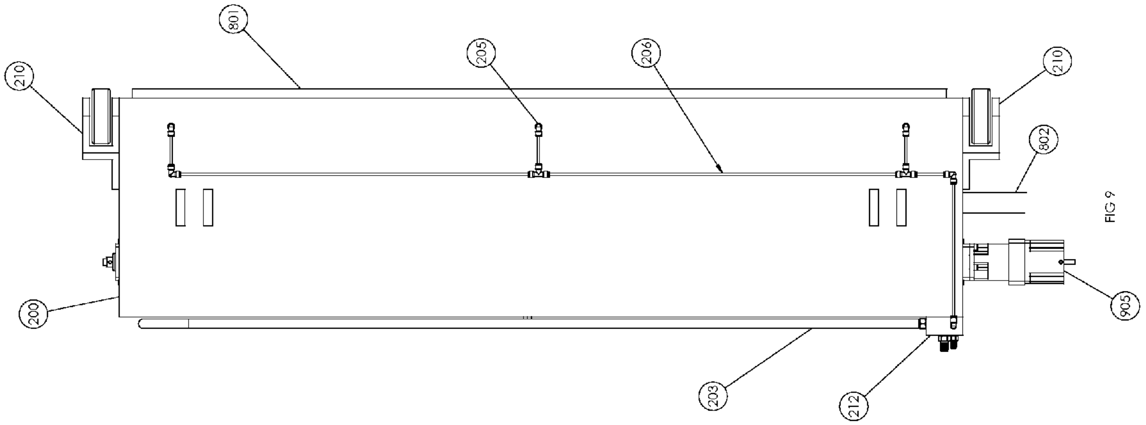
FIG. 9 is a side view of the chamber.
Figure 8:
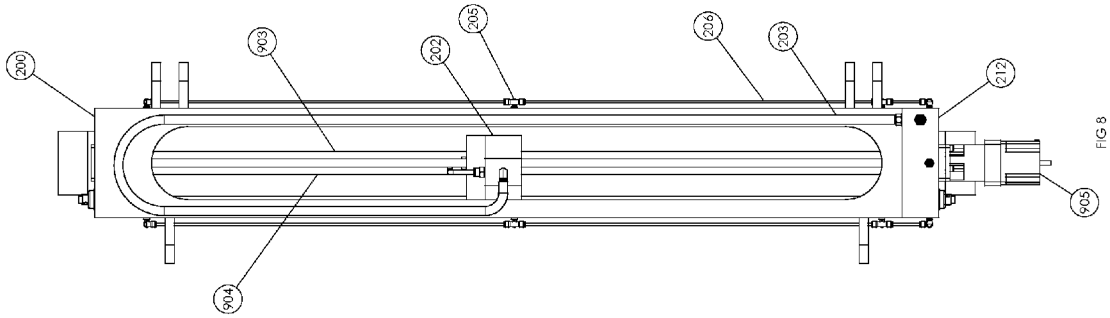
FIG. 8 is a top view of the air blow-down chamber subject of the disclosure.
Figure 12:
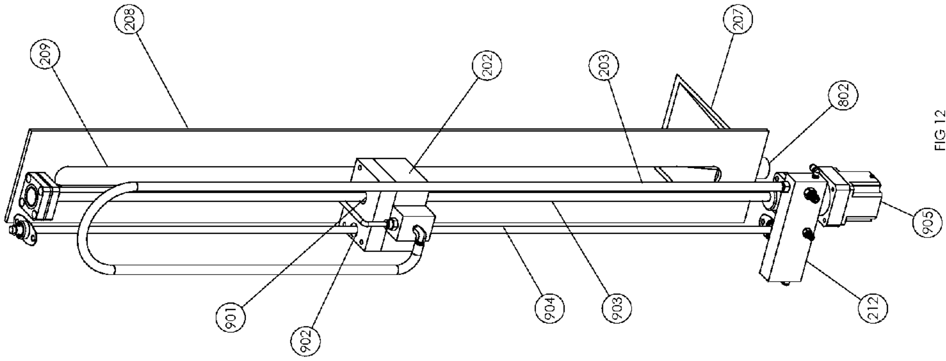
FIG. 12 is a top perspective view of the internal mechanism of the chamber.

Referencing FIG. 1, the compressed air blow-down chamber 200 following the pliant abrasive blast media chamber 100 removes the residual dust by means of air blow nozzle 201 (FIG. 10) mounted on a manifold block 202, which passes through a linear screw drive assembly 903 & 904 shown in FIG. 8. A detailed view of the screw drive assembly and nozzle is shown in FIG. 12. Shown is a ball screw 901 and an anti-rotational linear bearing 902. Also shown is a programmable rotational stepper motor 905. The air blow-down chamber 200 conforms to the tank wall by means of a flexible vacuum seal 801 (shown on FIGS. 9 and 10) for the mitigation of harmful emissions. The dislodged contaminates are captured by means of a re-circulating vacuum system return line 802 illustrated in FIG. 9.

Figure 2:
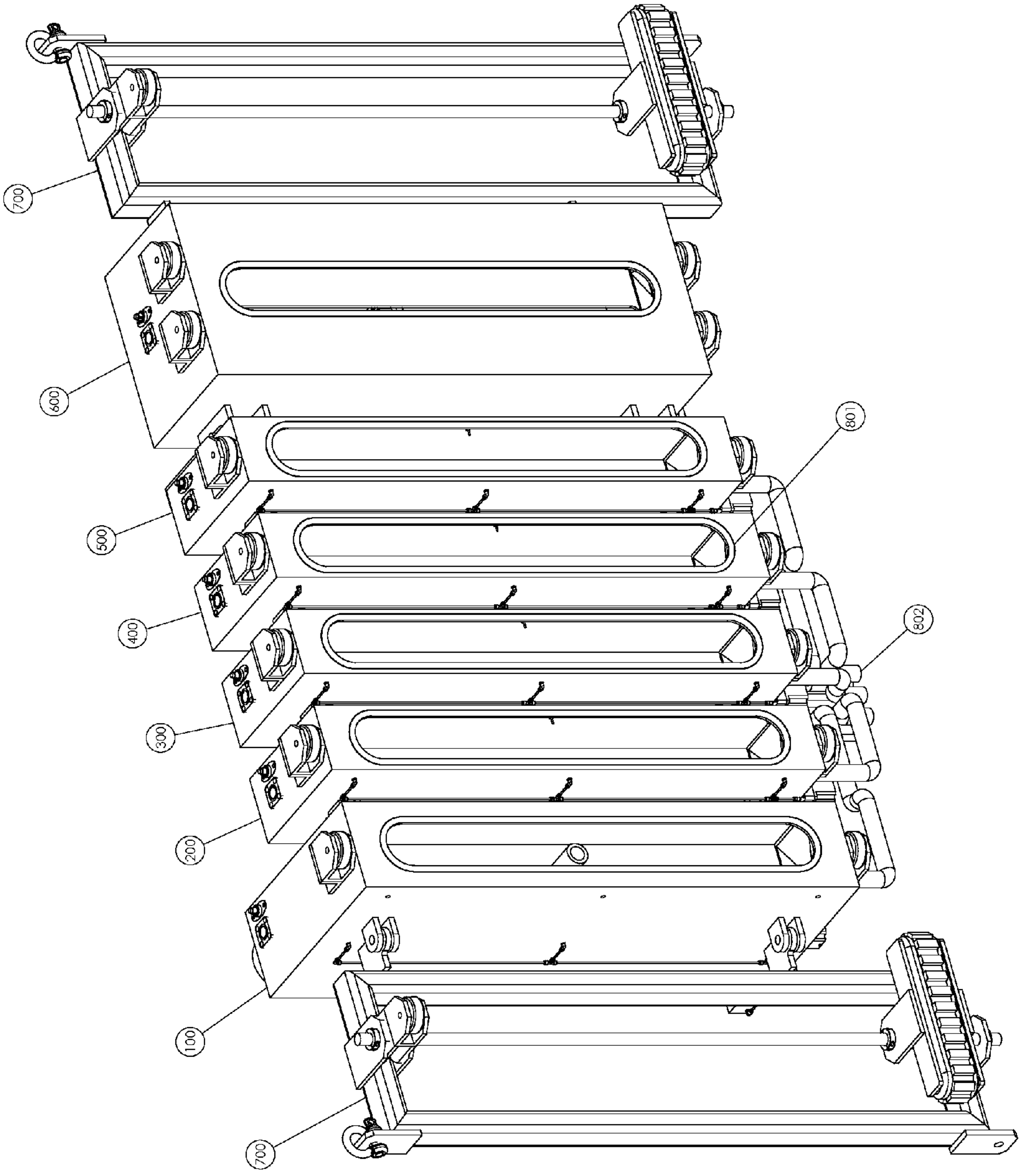
FIG. 2 is another perspective view showing the bottom sections of the chambers.
Figure 15:
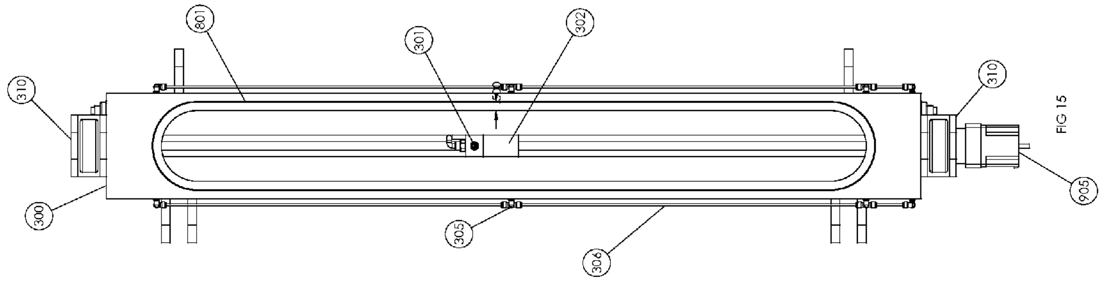
FIG. 15 is a bottom view of the chamber.
Figure 14:
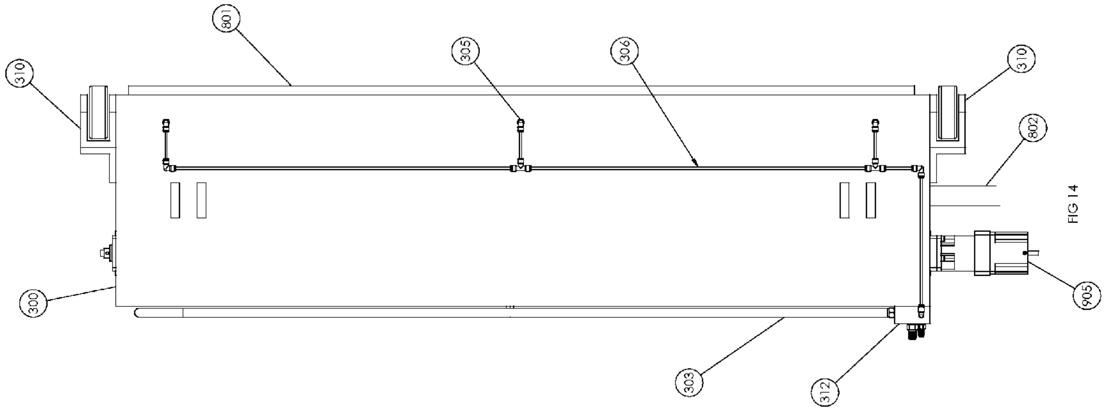
FIG. 14 is a side view of the chamber.
Figure 13:
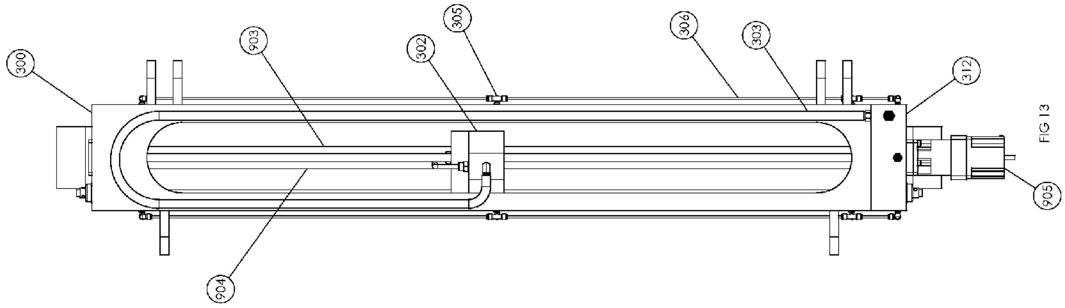
FIG. 13 is a top view of the salt mitigation chamber subject of the disclosure.

Referencing FIGS. 1 & 2, the salt mitigation chamber 300 following the air blow-down chamber applies a pressurized misting of direct to surface (DTS) soluble salt mitigation compound by means of misting nozzle 301 (FIG. 15) mounted on a manifold block 302, which passes through a linear screw drive assembly 903. The salt mitigation chamber 300 conforms to the tank wall by means of a flexible vacuum seal 801 (FIGS. 14 and 15) for the mitigation of harmful emissions. The dislodged contaminates are captured by means of a re-circulating vacuum system return line 802 shown in FIG. 14.

Figure 20:
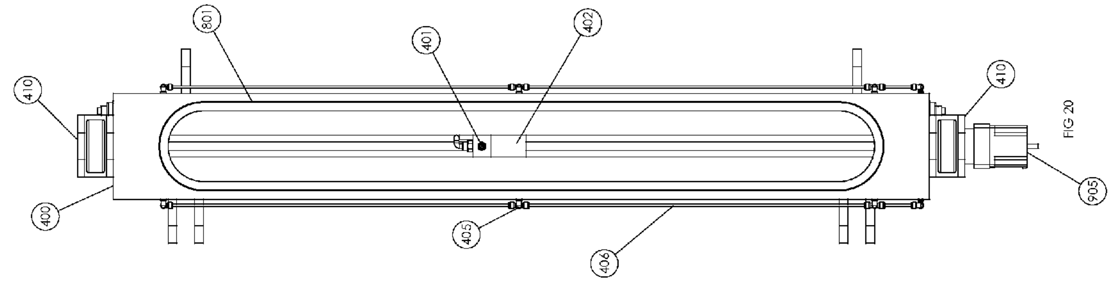
FIG. 20 is a bottom perspective view of the chamber.
Figure 19:
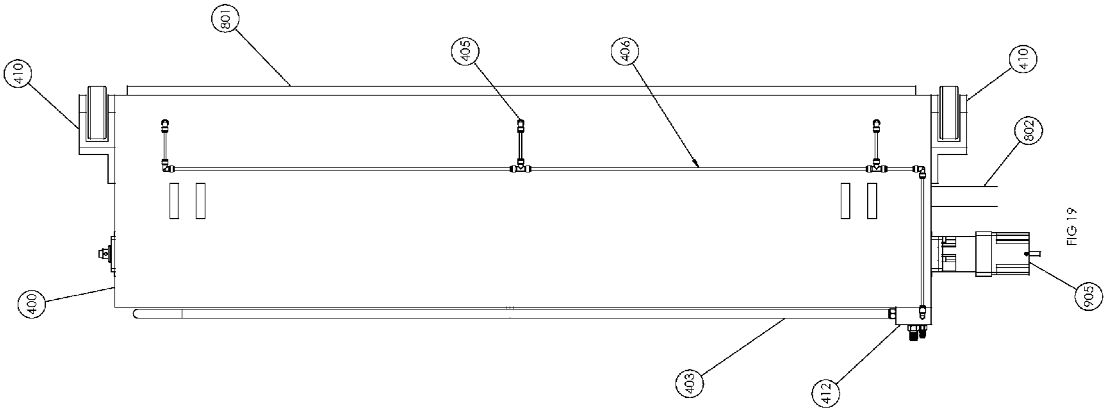
FIG. 19 is a side view of the chamber.
Figure 18:
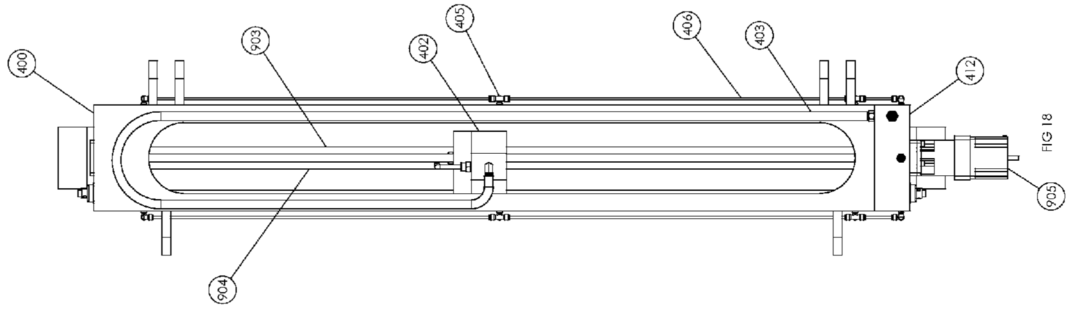
FIG. 18 is a top view of the fresh water rinse chamber subject of the disclosure.

Referencing again FIGS. 1 & 2, the fresh water rinse chamber 400 applies a medium pressure potable water rinses by means of pressure nozzle 401 mounted on a manifold block 402 (reference FIG. 20), which passes through a linear screw drive assembly 903 FIG. 18. The fresh water rinse chamber 400 conforms to the tank wall by means of a flexible vacuum seal 801 for the mitigation of harmful emissions. The flexible vacuum seal is illustrated in FIGS. 19 and 20. The fresh water rinse removes the previously applied soluble salt mitigation compound and any remaining contaminates from the previously created blast profile. The fresh water rinse and contaminates are removed and captured by means of a re-circulating vacuum system return line 802. (FIG. 19)

Figure 25:
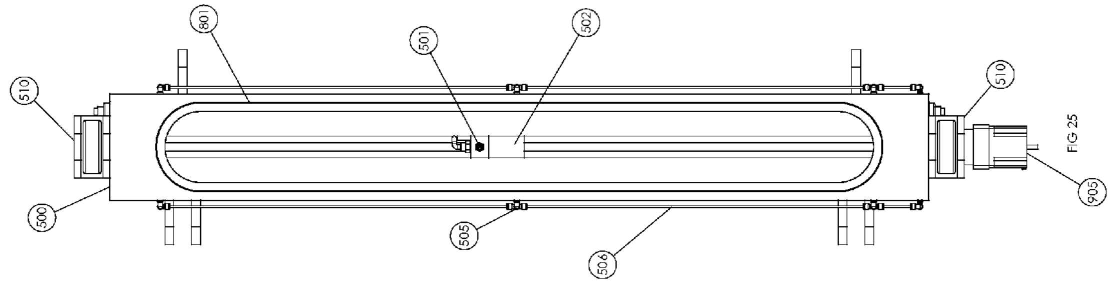
FIG. 25 is a bottom view of the chamber.
Figure 24:
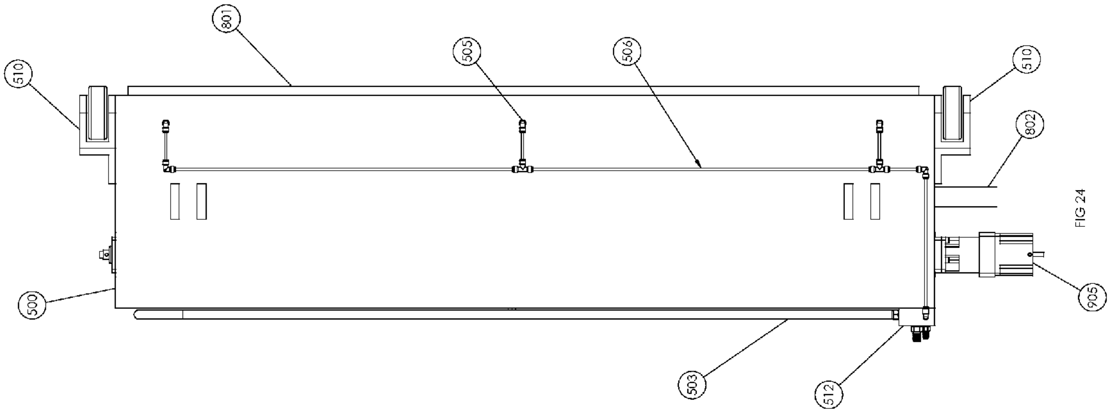
FIG. 24 is a side view of the chamber.
Figure 23:
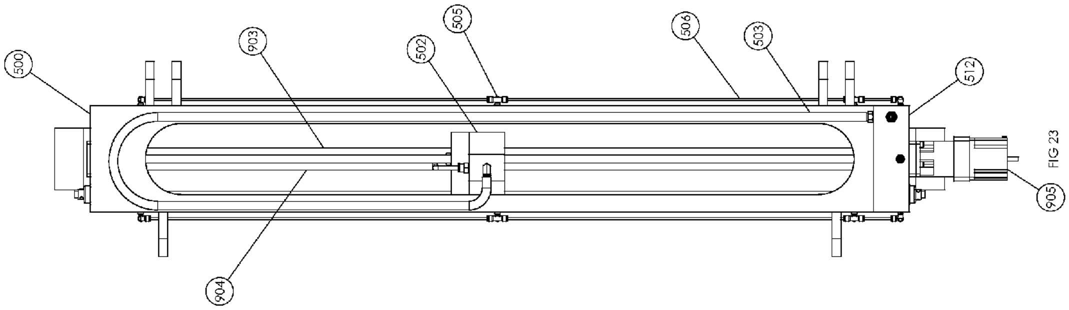
FIG. 23 is a top view of the drying chamber subject of the disclosure.

Referring to FIGS. 1 and 2, the drying chamber 500 follows the fresh water rinse chamber and removes any remaining surface moisture and contaminates by means of a compressed air blast nozzle 501 mounted on a manifold block 502, (FIGS. 24 and 25) which passes through a linear screw drive assembly 903 FIG. 23. The drying chamber 500 conforms to the tank wall by means of a flexible vacuum seal 801 for the mitigation of harmful emissions. The moisture and any remaining dislodged contaminates are removed and captured by means of a re-circulating vacuum system return line 802. (FIG. 24)

Figure 30:
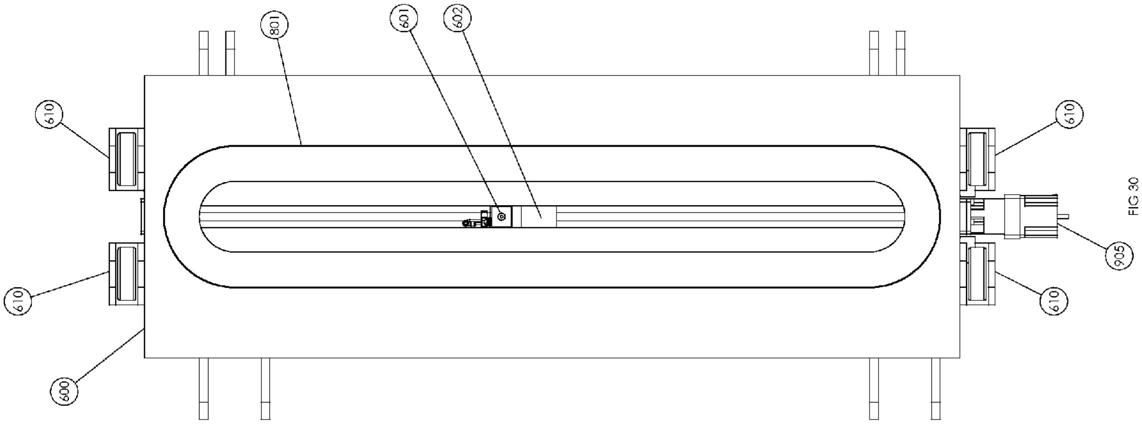
FIG. 30 is a bottom view of the chamber.
Figure 29:
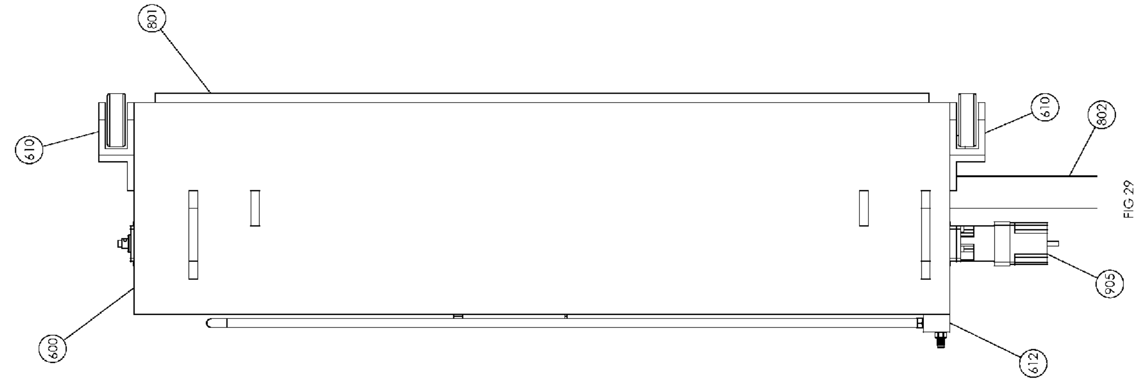
FIG. 29 is a side view of the chamber.
Figure 28:
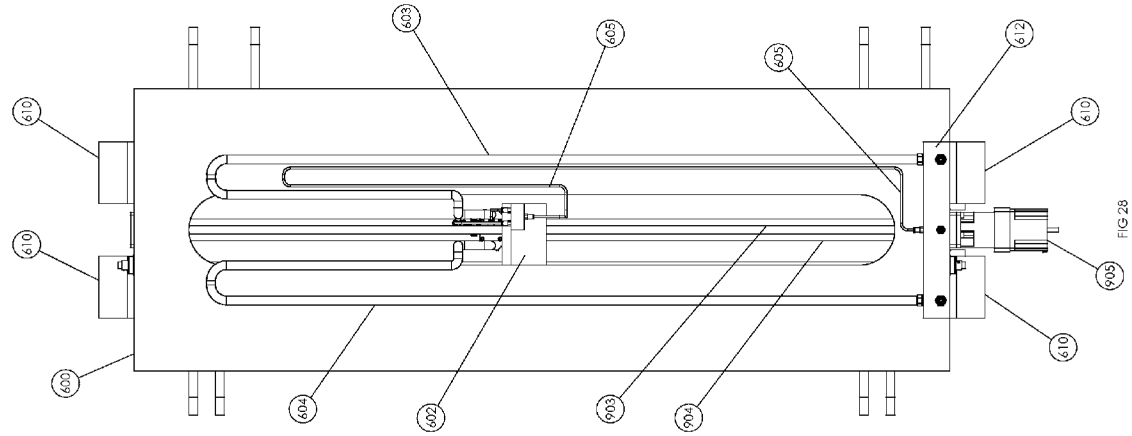
FIG. 28 is a top view of the coating chamber subject of the disclosure.
Figure 33:
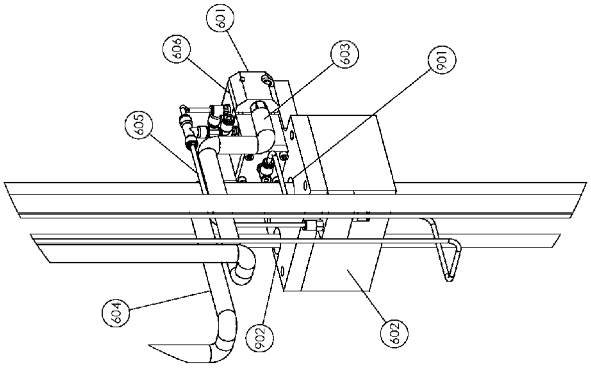
FIG. 33 is a detail perspective view of the spraying mechanism.
Figure 32:
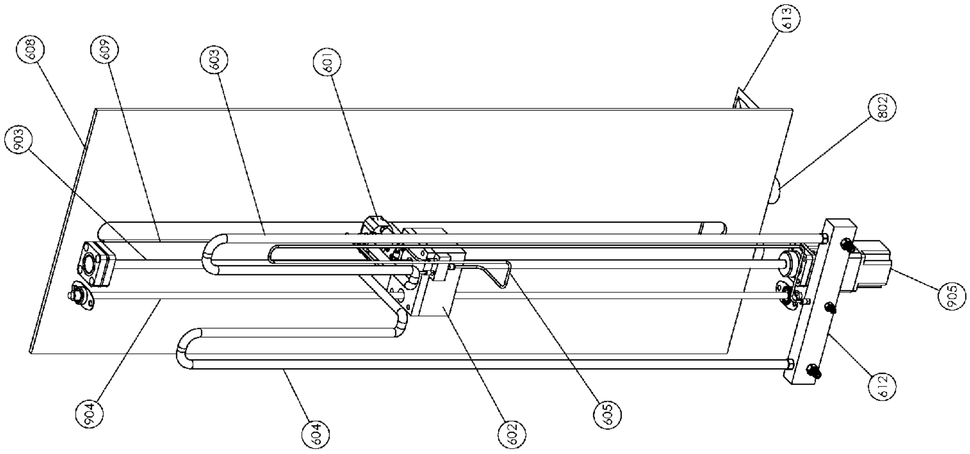
FIG. 32 is a top perspective view of the internal mechanism of the chamber.
Figure 31:
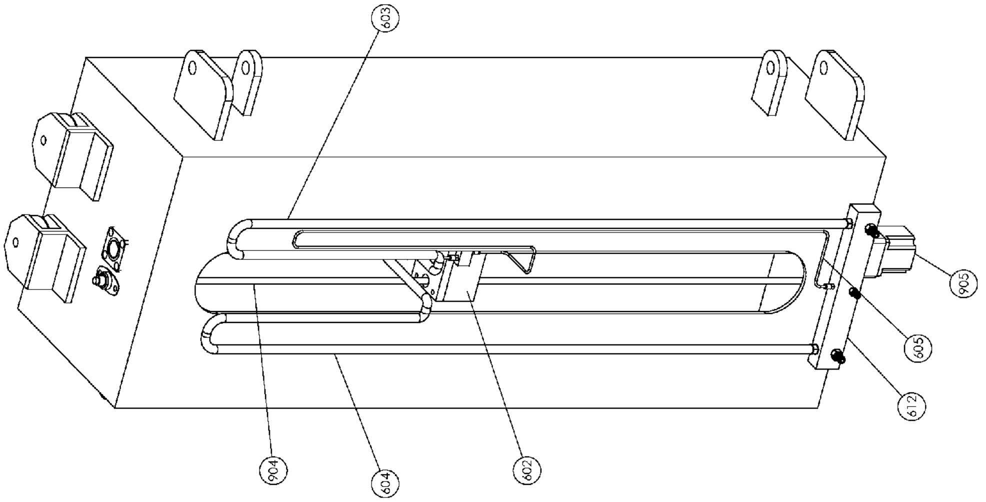
FIG. 31 is a top perspective view of the chamber.

Referencing FIGS. 1, 2 and 29, the coating chamber 600 follows the drying chamber and contains an apparatus that allows spraying of an isocyanate and amine resin mixture or other mixtures onto the prepared surface by means of an orbiting spray head 601 illustrated in FIG. 30 and FIG. 33. The orbiting spray head is mounted on a manifold block 602, which passes through a linear screw drive assembly 903 FIG. 28. The coating chamber 600 conforms to the tank wall by means of a flexible vacuum seal 801 for the mitigation of harmful emissions. Unattached resin particles are captured by means of a re-circulating vacuum system return line 802 shown in FIG. 29.

Figure 37:
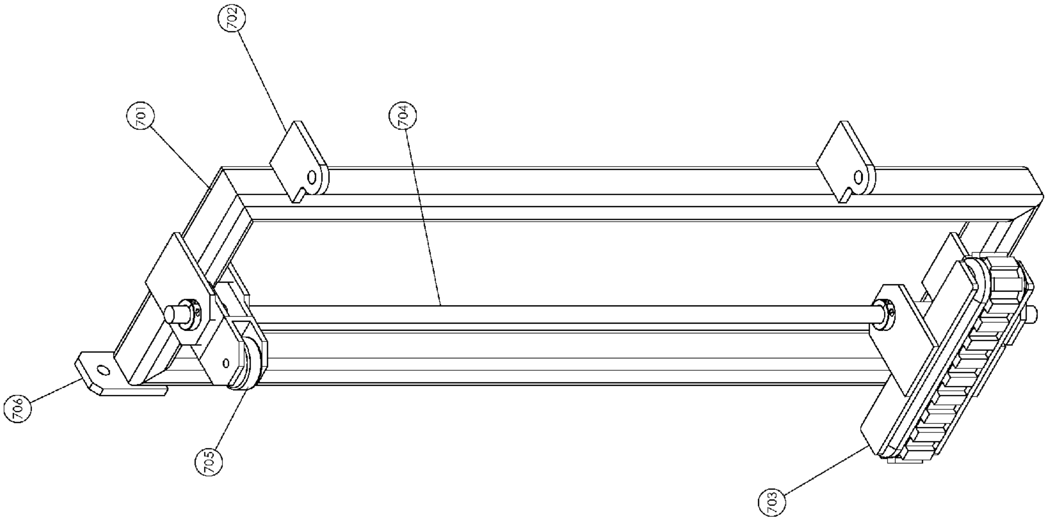
FIG. 37 is a perspective view of the drives.
Figure 36:
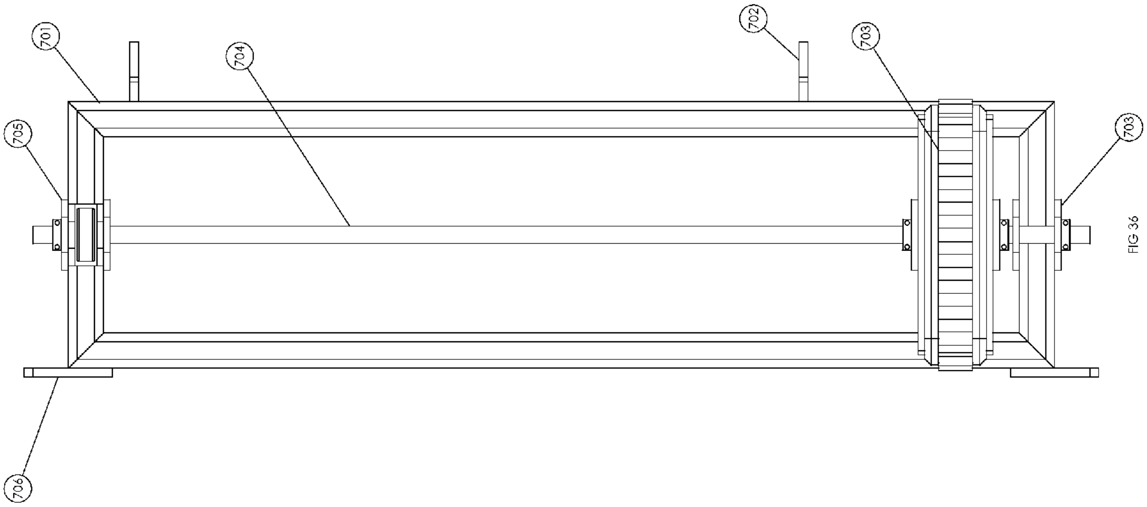
FIG. 36 illustrates a bottom view of the synchronized steerable tractor drives.

The robot is maneuvered across the surface by means of two synchronized tractor systems 700 at each end of the robot. An attachment frame 701 supports the tractor system. Attachment lugs 702 secure the tractor system to either side of the robot. The tractor drive 703 is supported off a central axially pivot 704 which allows the tractor drive to maintain constant contact with the radius of the tank. It will be appreciated that the radius comprises the outer wall of the tank. An idler brace wheel 705 maintains the proper distance from the tractor system and the tank surface. A support attachment 706 is also illustrated. See FIGS. 36 and 37. In one embodiment, a single tractor drive may be used.

Figure 38:
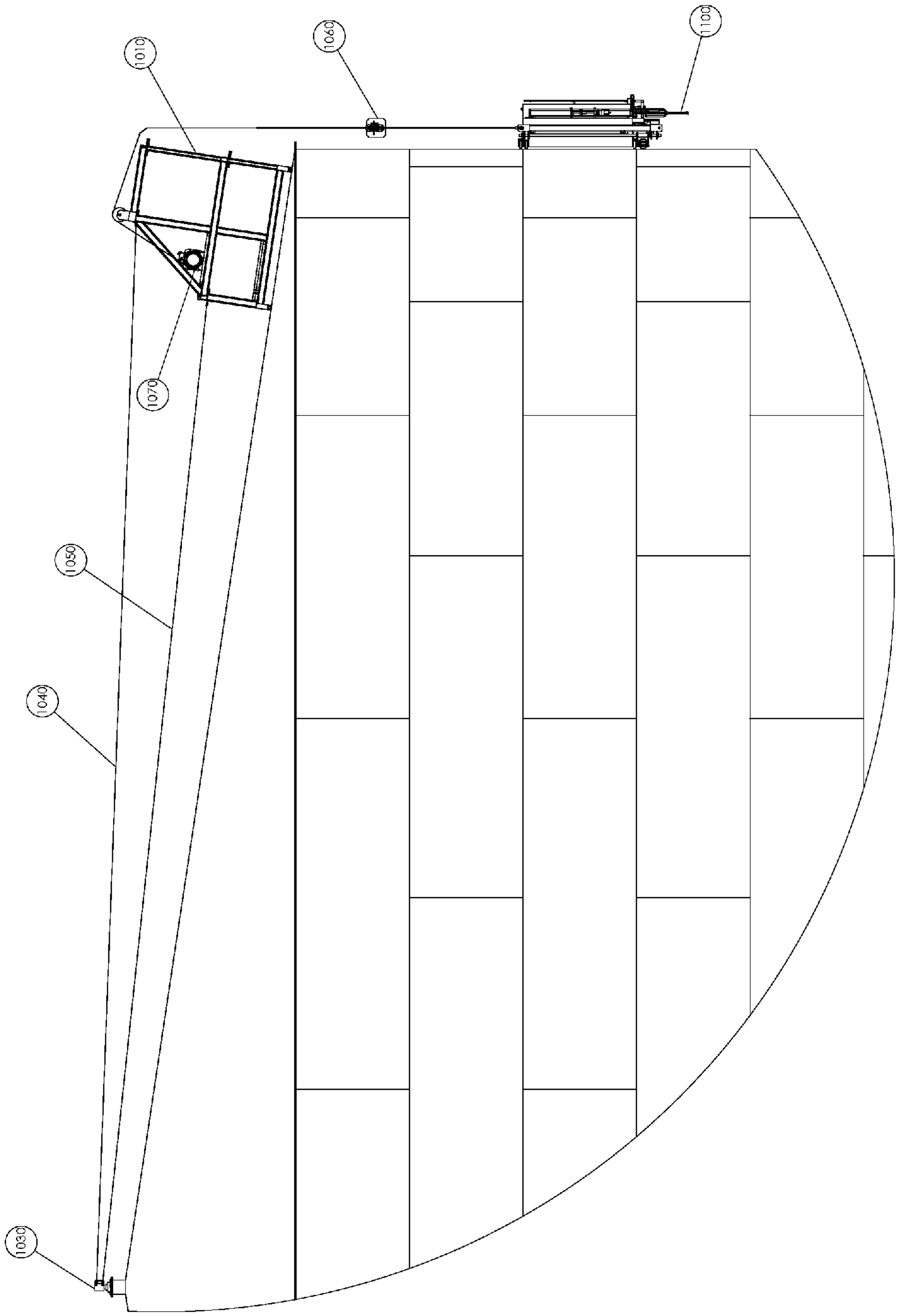
FIG. 38 is a side view of the robot mounting structure attached to a trunnion at the roof of the tank structure. Also illustrated is the robot suspended along the side of the tank wall.
Figure 39:
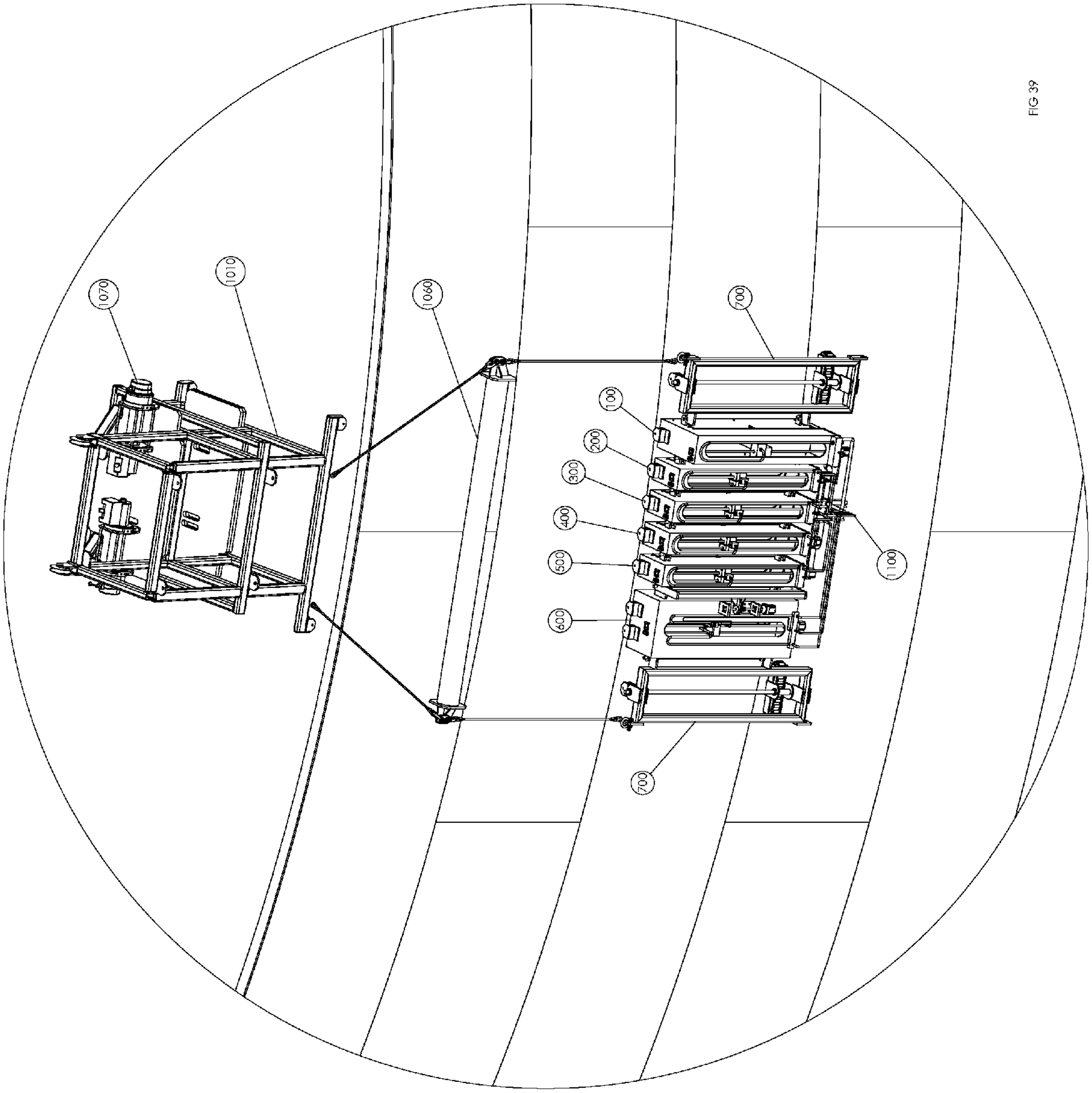
FIG. 39 is a perspective view of the davit structure mounting apparatus and the robot suspended along the side of the tank wall.

In tank coating operations, the robot is placed on the top uppermost edge of the tank and is suspended vertically by means of a remotely controlled scaffold support structure illustrated in FIG. 38. The support structure consists of a davit structure 1010 which rolls across the outermost edge of the tank by means of contact rollers or guide wheels. The support structure is braced on the tank centerline by a rotational trunnion 1030. The rotation trunnion is secured to the center of the tank structure and allowed to rotate 360 degrees. The support structure is secured to the rotational trunnion be means of upper 1040 and lower 1050 wire rope cable supports. The robot is secured to the tank surface by means of a spreader bar 1060 FIGS. 38 and 39 with one end attached to the two tractor systems 700 and the other end attached to the support structure by means of cable winches 1070 FIG. 39. The cable winches allow for the entire robot to be raised or lowered along the tank surface.

A detachable umbilical 1100) with product delivery lines, re-circulating vacuum system return lines, pneumatic lines, electrical power, signal and video lines contained within remains attached to the robot during the lining operation.

The pliant abrasive blast media chamber 100 removes surface contaminants by means of a pliant abrasive blast media that expands on impact exposing abrasive then contracts creating vacuum, which in turn entraps contaminants. The pliant blast media is applied to the tank wall by means of a blast nozzle 101. The shape of style of which may be altered or interchanged to suit varying surface contaminates and irregularities. Referencing FIGS. 3 and 5, the blast nozzle 101 is mounted on a manifold block 102 and the blast nozzle is fed blast media by means of a supply hose 111. Referencing FIGS. 3 and 4, a distribution block 112 provides both the pliant abrasive blast media and compressed air.

Figure 7:
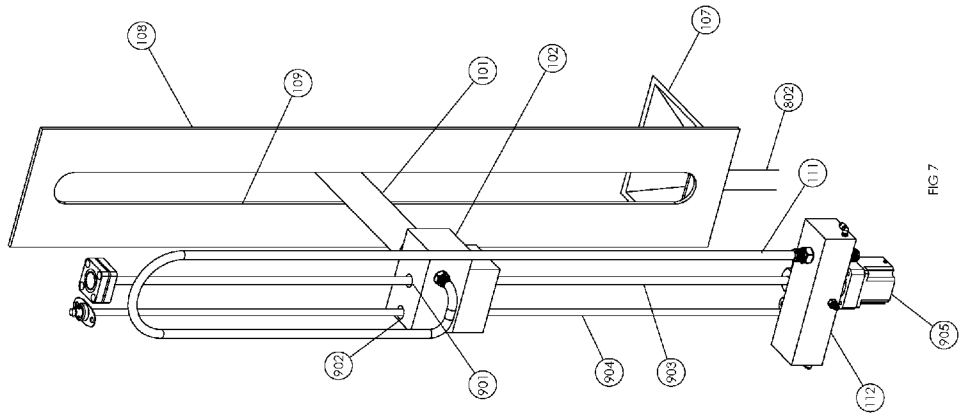
FIG. 7 is an internal perspective view of the chamber.
Figure 6:
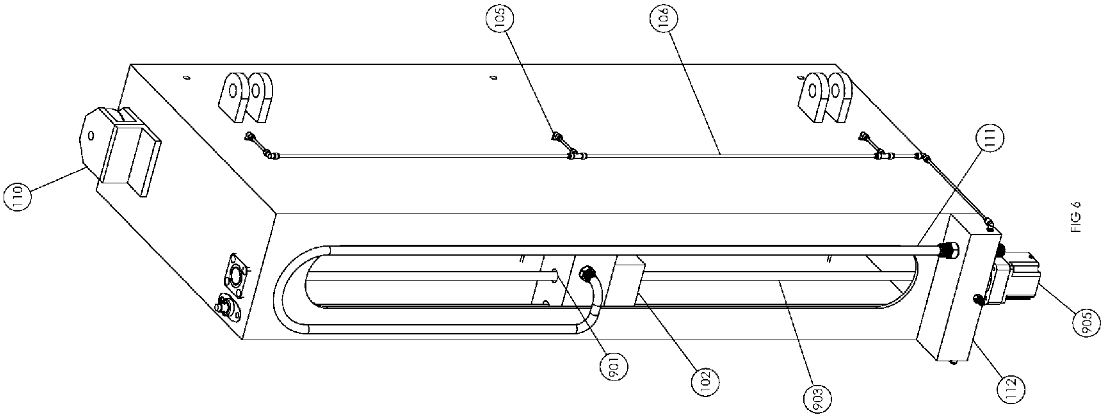
FIG. 6 is a top perspective view of chamber showing the pivoting linkage attachments.

The linear screw drive assembly 900 provides for linear vertical oscillating motion of 24 inches of the blast nozzle 101. It will be appreciated that the distance of the oscillating motion can be varied. Referencing FIGS. 6 and 7, the manifold contains a ball screw 901 and an anti-rotational linear bearing 902. The manifold is driven vertically along side the tank wall by means of a linear screw 903 and prevented from rotating about the screw axis by an anti-rotational shaft 904. A programmable rotational stepper motor 905 drives the linear screw 903. During the operation of the robot horizontal travel along the side of the tank wall is programmed to match the blast nozzles vertical oscillation, ensuring the full coverage of the exposed surface is maintained.

Compressed air nozzles 105 fed by compressed air lines 106 are strategically placed along the chamber. The compressed air is fed to the compressed air lines 106 by the distribution block 112. The compressed air nozzles are orientated towards the tank surface with a horizontal pointing bias, (assuming the apparatus is position on a vertical tank wall) thus aiding in the flow of contaminates and pliant abrasive material to the collection orifice 107 shown in FIG. 7. Contact rollers or guide wheels 110 (FIGS. 5 and 6) can be used to maintain the proper offset distance from the tank wall, i.e., positional adjustable chamber components. An internal baffle plate 108 and baffle scrubber brush 109 retard the particle flow out the backside of the chamber.

A re-circulating vacuum system return line 802 captures the materials. The re-circulating vacuum system separates contaminates from the pliant abrasive blast media. Contaminates are stored in an appropriate containment vessel for proper disposal while the pliant abrasive blast media is re-circulated into the system. A flexible vacuum seal 801 (FIGS. 4 and 5) maintains contact between the pliant abrasive blast media chamber 100 and the tank wall to further mitigate the release of harmful emissions.

The air blow down chamber 200 (FIG. 8) removes the residual dust and partials by means of high-pressure dried air. The high-pressure air is applied to the tank wall by means of an air nozzle 201. The blast nozzle 201 is mounted on a manifold block 202 and the air blow down nozzle is fed high-pressure dried air by means of a supply hose 203. A distribution block 212 provides both the high-pressure dried air and compressed air. The linear screw drive assembly 900 provides for linear vertical oscillating motion of 24 inches of the air nozzle 201. The manifold block contains a ball screw 901 and an anti-rotational linear bearing 902. The manifold block is driven vertically by means of a linear screw 903 and prevented from rotating about the screw axis by an anti-rotational shaft 904. A programmable rotational stepper motor 905 drives the linear screw 902. During the operation of the robot the vertical oscillation of the manifold block 202 is programmed to be two times the speed of the blast nozzle's 101 vertical oscillation, ensuring the complete removal of any loose material remaining on the exposed surface.

Figure 11:
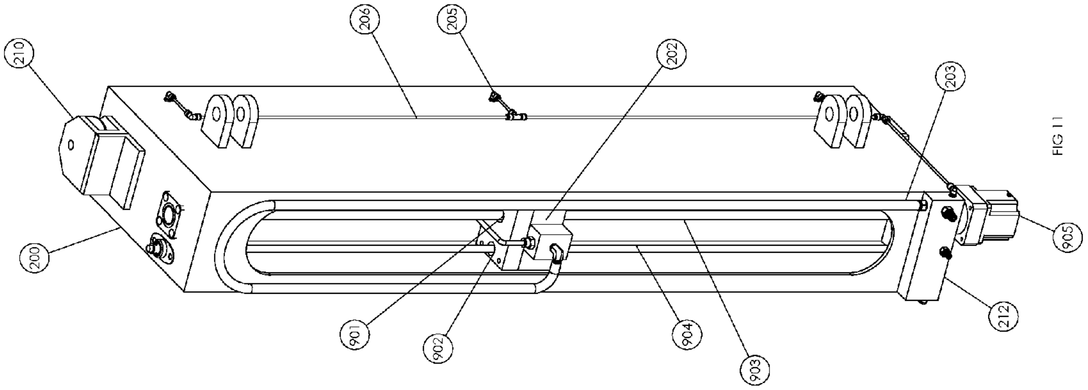
FIG. 11 is a top perspective view of the chamber showing the external air jets and the linkage mechanism.

Compressed air nozzles 205 fed by compresses air-lines 206 are strategically places along the walls (reference FIG. 11). The compressed air is feed to the compressed air lines 206 by the distribution block 212. The compressed air nozzles are orientated towards the tank surface with a downward pointing bias, thus aiding in the downward flow of contaminates to the collection orifice 207 (reference FIG. 12). Contact rollers or guide wheels 210 (reference FIGS. 10 and 11) are used to maintain the proper offset distance from the tank wall.

An internal baffle plate 208 and baffle scrubber brush 209 retard the particle flow out the backside of the chamber. A re-circulating vacuum system return line 802 captures the materials. The re-circulating vacuum system separates and stores the contaminants in appropriate containment vessel for proper disposal. A flexible vacuum seal 801 maintains contact between the air blow down chamber 200 and the tank wall to further mitigate the release of harmful emissions.

Figure 17:
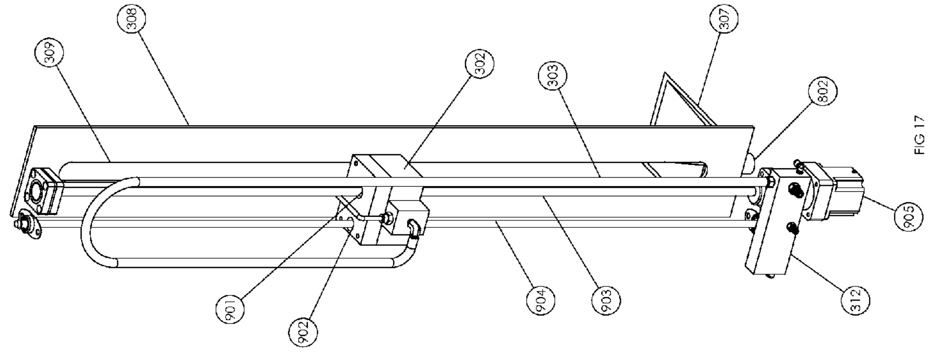
FIG. 17 is a top perspective view of the internal mechanism of the chamber.
Figure 16:
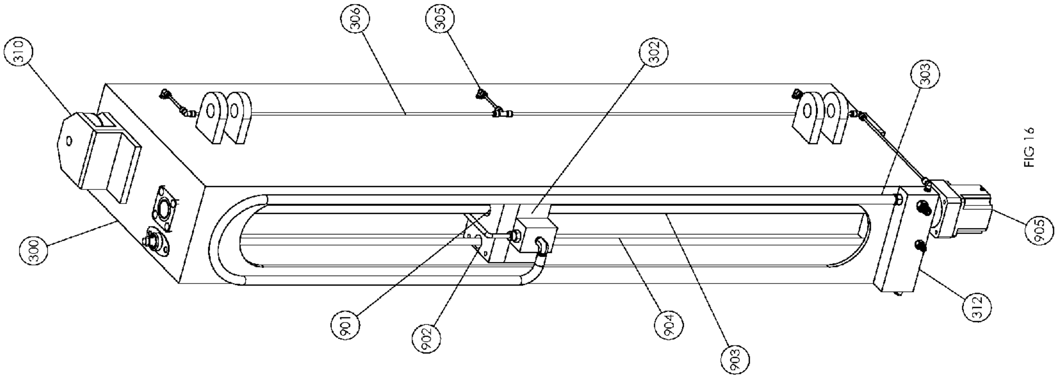
FIG. 16 is a top perspective view of the chamber.

The salt mitigation chamber 300 applies a pressurized misting of direct to surface (DTS) soluble salt mitigation compound by means of misting nozzle 301. The misting nozzle 301 is mounted on a manifold block 302 and the misting nozzle 301 is fed the soluble salt mitigation solution by means of a supply hose 303. A distribution block 312 provides both the soluble salt mitigation compound and compressed air. The linear screw drive assembly 900 provides for linear vertical oscillating motion of 24 inches. The manifold contains a ball screw 901 and an anti-rotational linear bearing 902. The manifold is driven vertically by means of a linear screw 903 and prevented from rotating about the screw axis by an anti-rotational shaft 904. A programmable rotational stepper motor 905 drives the linear screw 903. During the operation of the robot the vertical oscillation of the manifold block 302 is programmed to be three times the speed of the blast nozzle's 101 vertical oscillation, ensuring the complete coverage of the exposed surface by the salt mitigation solution. Referencing FIG. 14, compressed air nozzles 305 fed by compresses air-lines 306 are strategically places along the chamber walls. The compressed air is fed to the compressed air lines 306 by the distribution block 312. The compressed air nozzles are orientated towards the tank wall surface with a horizontal pointing bias, thus aiding in the flow of residual salt mitigation solution to the collection orifice 307. (Reference FIGS. 16 and 17.) Adjustable or positionable contact rollers or guide wheels 310 may be used to maintain the proper offset distance from the tank wall. An internal baffle plate 308 and baffle scrubber brush 309 (reference FIG. 17) retard the particle flow out the backside of the chamber. A re-circulating vacuum system return line 802 captures the residual salt mitigation solution. The re-circulating vacuum system separates and stores the contaminates in appropriate containment vessels for proper disposal. A flexible vacuum seal 801 maintains contact between the salt mitigation chamber 300 and the tank wall to further mitigate the release of harmful emissions.

Figure 22:
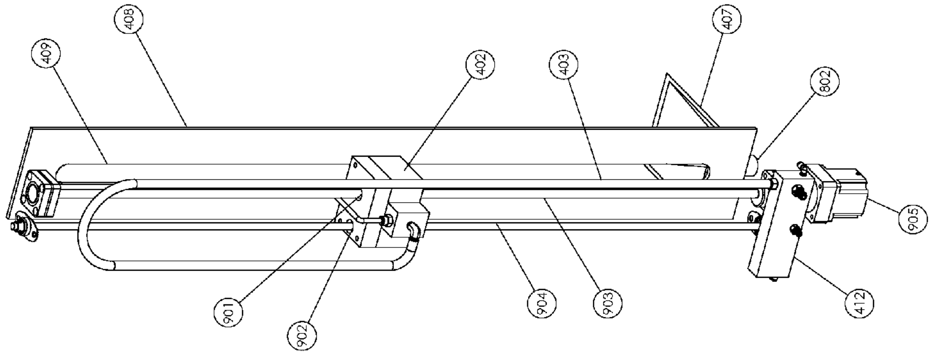
FIG. 22 is a top perspective view of the internal mechanism of the chamber.
Figure 21:
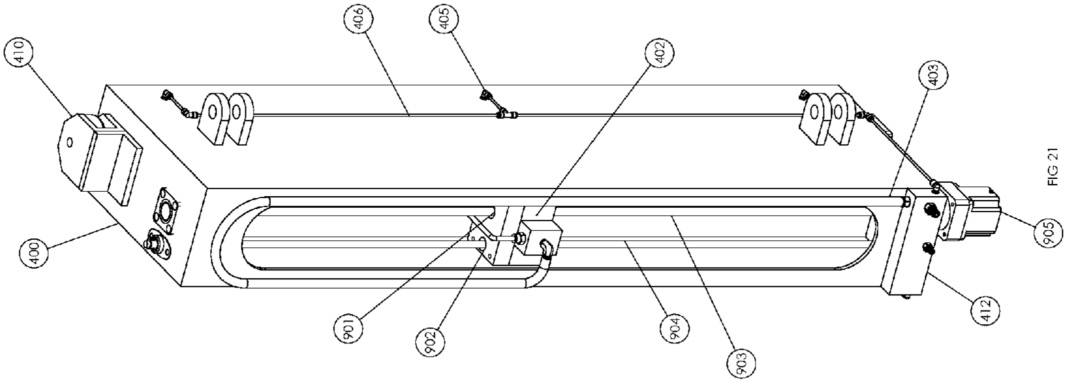
FIG. 21 is a top perspective view of the chamber.

The fresh water rinse 400 applies medium pressurized potable water by means of pressure nozzle 401. FIG. 18 is a top view of the fresh water rinse chamber. FIG. 19 is a side view of the chamber and FIG. 20 is a bottom view of the fresh water rinse chamber. The pressure nozzle 401 is mounted on a manifold block 402 and the pressure nozzle 401 is fed the potable water rinses by means of a supply hose 403. A distribution block 412 provides both the medium pressurized potable water and compressed air. The linear screw drive assembly 900 provides for linear vertical oscillating motion of 24 inches. The manifold contains a ball screw 901 and an anti-rotational linear bearing 902. The manifold is driven vertically by means of a linear screw 903 and prevented from rotating about the screw axis by an anti-rotational shaft 904. A programmable rotational stepper motor 905 drives the linear screw 903. During the operation of the robot the vertical oscillation of the manifold block 402 is programmed to be two times the speed of the blast nozzle's 101 vertical oscillation, ensuring the complete rise of the exposed surface and removal of any residual solutions or particles. Compressed air nozzles 405 fed by compressed air-lines 406 are strategically places along the chamber walls. The compressed air is fed to the compressed air lines 406 by the distribution block 412. The compressed air nozzles are orientated towards the tank surface with a horizontal pointing bias, (assuming the apparatus is positioned on the vertical surface of a structure) thus aiding in the horizontal flow of water, residual solution, and particles to the collection orifice 407. Contact rollers or guide wheels 410 are used to maintain the proper offset distance from the tank wall. (Reference FIGS. 20 and 21.) An internal baffle plate 408 FIG. 22 and baffle scrubber brush 409 FIG. 22 retard the particle flow out the backside of the chamber. A re-circulating vacuum system return line 802 captures the water, residual solution, and particles. The re-circulating vacuum system separates and stores the contaminates in appropriate containment vessels for proper disposal. A flexible vacuum seal 801 maintains contact between the fresh water rinse chamber 400 and the tank wall to further mitigate the release of harmful emissions.

Figure 27:
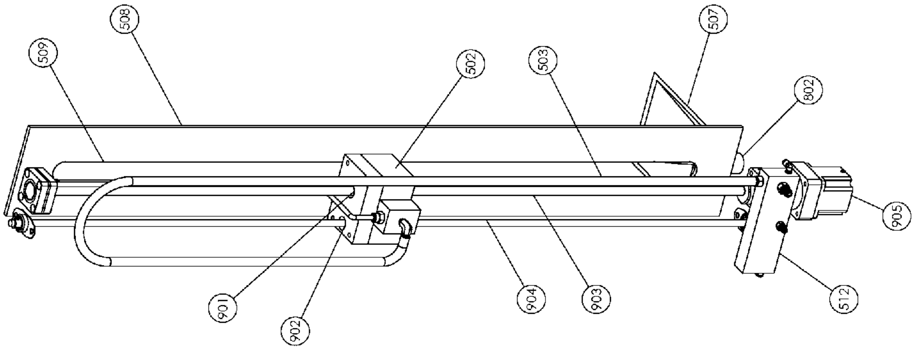
FIG. 27 is a top perspective view of the internal mechanism of the chamber.
Figure 26:
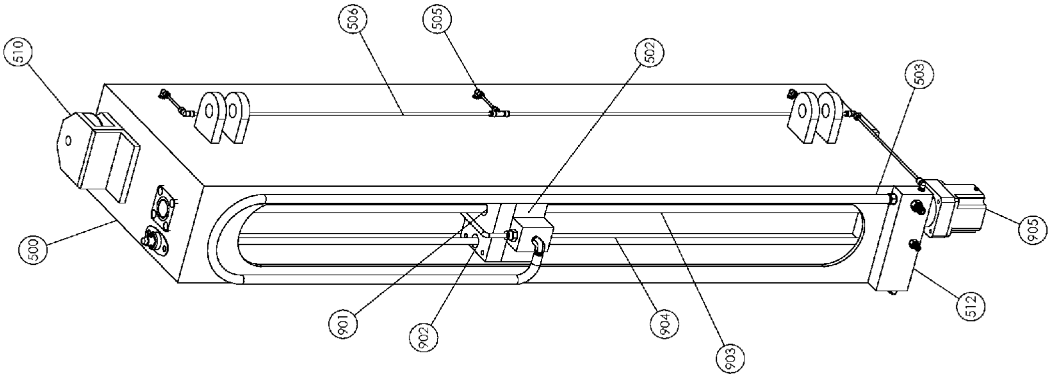
FIG. 26 is a top perspective view of chamber.

The drying chamber 500 applies high-pressure dried air by means of an air blast nozzle 501. The air blast nozzle 501 is mounted on a manifold block 502 and the air blast nozzle 501 is fed high-pressure dried air by means of a supply hose 503. A distribution block 512 provides both applies high-pressure dried and compresses air. The linear screw drive assembly 900 provides for linear vertical oscillating motion of 24 inches. The manifold contains a ball screw 901 and an anti-rotational linear bearing 902. The manifold is driven vertically by means of a linear screw 903 and prevented from rotating about the screw axis by an anti-rotational shaft 904. A programmable rotational stepper motor 905 drives the linear screw 903. During the operation of the robot the vertical oscillation of the manifold block 502 is programmed to be three times the speed of the blast nozzle's 101 vertical oscillation, ensuring the complete drying of the exposed surface and removal of any residual solutions or particles. Compressed air nozzles 505 fed by compresses air-lines 506 are strategically placed along the chamber walls. The compressed air is fed to the compressed air lines 506 by the distribution block 512. The compressed air nozzles are orientated towards the tank surface with a downward pointing bias, thus aiding in the downward flow of water, residual solution, and particles to the collection orifice 507. Contact rollers 510 are used to maintain the proper offset distance from the tank wall, i.e., position adjustable chamber component. An internal baffle plate 508 FIG. 27 and baffle scrubber brush 509 FIG. 27 retard the particle flow out the backside of the chamber. A re-circulating vacuum system return line 802 captures the water, residual solution, and particles. The re-circulating vacuum system separates and stores the contaminates in appropriate containment vessels for proper disposal. A flexible vacuum seal 801 maintains contact between the drying chamber 500 and the tank wall to further mitigate the release of harmful emissions.

The coating chamber 600 (FIGS. 28-35) contains an apparatus and that allows spraying of an isocyanate and amine resin mixture or other mixtures onto the prepared surface by means of an orbiting spray head 601. The orbiting spray head 601 is mounted on a manifold block 602. The orbiting spray head is fed a two-part resin by means of product supply hoses 603 and 604 and compressed air 605. The distribution block 612 feeds the two-part resin supply hoses and compressed air line. The orbiting spray head is maintained at the proper temperature by means of a flexible heater blanket 606.

The orbiting spray head can be maintained at the proper distance from the surface by adjustment or positioning of contact rollers or guide wheels 610 to maintain the proper offset distance from the tank wall. An internal baffle plate 608 and baffle scrubber brush 609 retards the particle flow out the backside of the chamber. The plate that divides the chamber, separating the spray head, lines, and screw drive from the side where the material is being sprayed on the surface. The linear screw drive assembly 900 provides for linear vertical oscillating motion of 24 inches. The manifold contains a ball screw 901 and an anti-rotational linear bearing 902. Reference FIG. 33. The manifold is driven vertically by means of a linear screw 903 and prevented from rotating about the screw axis by an anti-rotational shaft 904.

In all six instances of the linear screw drive assembly the anti-rotational shaft operates the same. The linear screw 903 rotates by means of the stepper motor 905. This rotation of the linear screw drives the ball screw 903 up or down depending on the rotation of the stepper motor 905. However, while the ball screw moves up and down, the rotational element of the linear screw will tend to rotate the ball screw about the linear screw's axis. To avoid this rotation, a second shaft, the anti-rotational shaft 904 and linear bearing 902 are added to the system. The anti-rotational shaft and bearing prevent the rotational tendency of the ball screw by physically preventing the manifold block from rotating about the linear screw axis.) A programmable rotational stepper motor 905 drives the linear screw 903. During the operation of the robot the vertical oscillation of the manifold block 602 is programmed to be two times the speed of the blast nozzle's 601 vertical oscillation, ensuring the complete coverage of the exposed surface by the applied coating.

Contact rollers or guide wheels 610 are used to maintain the proper offset distance from the tank wall. An internal baffle plate 608 and baffle scrubber brush 609 (See FIG. 32) retards the particle flow out the backside of the chamber. An additional baffle plate 613 is illustrated. The plate that divides the chamber, separating the spray head, lines, and screw drive from the side where the material is being sprayed on the surface. This operation is identical in all six chambers. 608 is an internal baffle plate that separates the chamber in two sections as described above. The plate has a slot down the middle, allowing only the spray nozzle to protrude. While this protects most of the back half of the chamber from contaminates, the slot is still open above and below the nozzle as it travels up and down the screw drive. Contaminate passage through the slot is further retarded by baffle scrubber brush. These are pliable brushes that extend on either side of the slot. As the spray head travels up and down the slot, the pliable brushed are physically pushed out of the way by the nozzle and then return to place once the nozzle has passed by. A re-circulating vacuum system return line 802 (captures any unattached resin particles). The re-circulating vacuum system separates and stores the contaminates in appropriate containment vessels for proper disposal. A flexible vacuum seal 801—maintains contact between the coating chamber 600 and the tank wall to further mitigate the release of harmful emissions.

Figure 35:
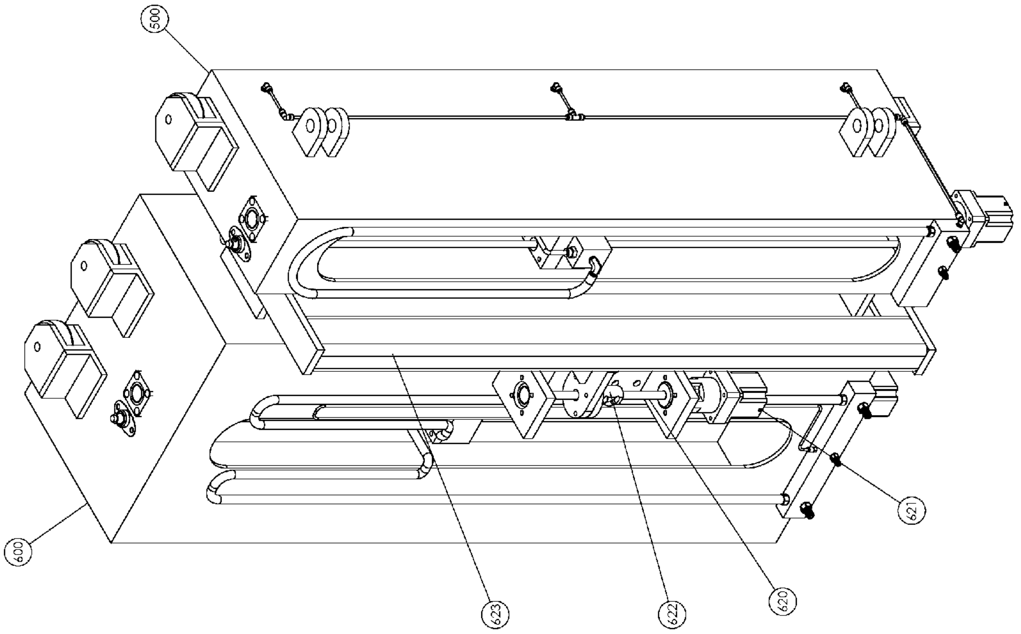
FIG. 35 is a top perspective view of the coating chamber and drying chamber.
Figure 34:
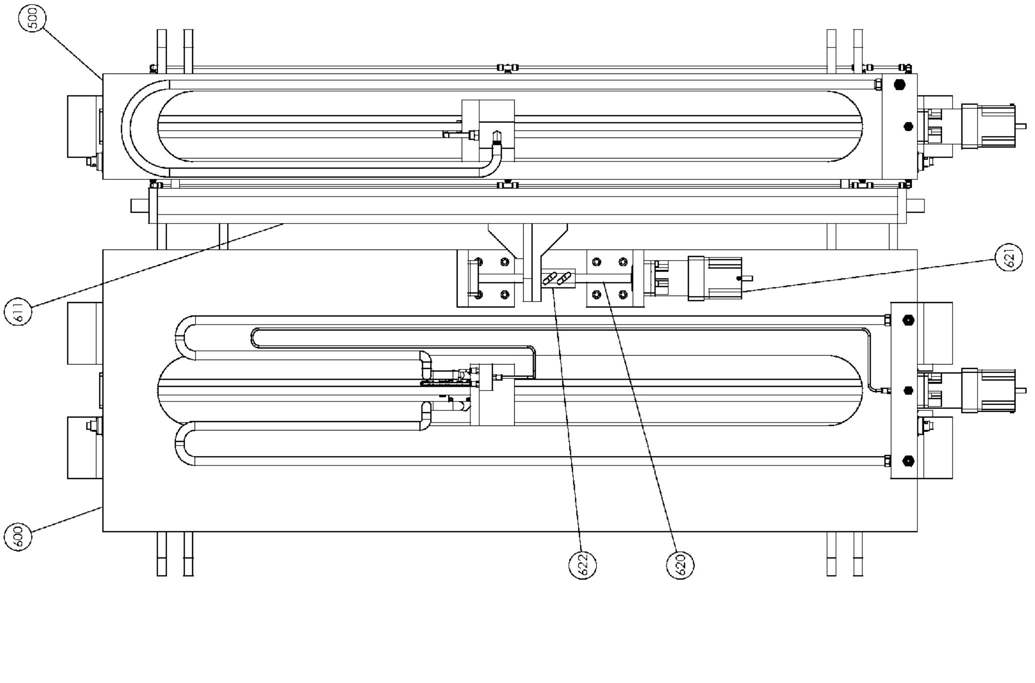
FIG. 34 is a top view of the coating chamber and the drying chamber.

FIG. 35 illustrates a linear offset screw drive assembly allows for the vertical adjustment of the coating chamber 600. A stepper motor 621 drives the linear screw 620 and a ball screw 622 is attached to the coating chamber by means of a support bar frame 623. The linear stepper motor 621 is operator controlled and allows for the vertical position of the coating chamber 600 to be adjusted +/−1" off the horizontal centerline of the robots travel. FIG. 34 illustrates another view of the support bar frame 611.

This specification is to be construed as illustrative only and is for the purpose of disclosing to those skilled in the art the manner of carrying out the invention. It is to be understood that the forms of the invention herein shown and described are to be taken as the presently preferred embodiments. As already stated, various changes may be made in the shape, size and arrangement of components or adjustments made in the steps of the method without departing from the scope of this invention. For example, equivalent elements may be substituted for those illustrated and described herein and certain features of the invention maybe utilized independently of the use of other features, all as would be apparent to one skilled in the art after having the benefit of this disclosure of the invention.

While specific embodiments have been illustrated and described, numerous modifications are possible without departing from the spirit of the invention, and the scope of protection is only limited by the scope of the accompanying claims.

What I claim is:

1. A plurality of linked segmented chambers adapted to traverse surfaces comprising:

a) a first pivotable attachment component comprising a tractor pulling chamber traversing a surface;

b) a second pivotable attachment component comprising a wheeled abrasive media dispersion chamber with, a laterally oscillating nozzle and a vacuum system oriented to the surface traversed by the tractor pulling chamber;

c) a third pivotable attachment component comprising a wheeled spray coating chamber having, a laterally oscillating nozzle and a vacuum system oriented to the surface traversed by the tractor pulling chamber; wherein the first pivotable attachment component of the tractor is attached to the abrasive media dispersion chamber and the second pivotable attachment component of the abrasive media dispersion chamber is attached to the spray coating chamber.

2. The plurality of linked segmented chambers of claim 1 further comprising one or more chambers creating a vacuum with a surface.

3. The plurality of linked segmented chambers of claim 2 wherein the surface has a radius oriented longitudinal to a direction of apparatus of travel.

4. The plurality of linked segmented chambers of claim 2 wherein the plurality of linked segmented chambers further includes an air blow-down chamber, a salt mitigation chamber, a water rinse chamber, and a drying chamber.

5. The plurality of linked segmented chambers of claim 4 further comprising at least one chamber comprising an internal baffle plate.

6. The plurality of linked segmented chambers of claim 4 further comprising a collection orifice.

7. The plurality of linked segmented chambers of claim 1 further comprising at least one chamber comprising a vacuum seal in communication with the surface.

8. The plurality of linked segmented chambers of claim 1 wherein the oscillating nozzle or port utilizes a stepper motor.

9. The plurality of linked segmented chambers of claim 1 further comprising a position adjustable spray chamber.

10. The plurality of linked segmented chambers of claim 1 further comprising at least one chamber containing a wheel.

11. The plurality of linked segmented chambers of claim 10 wherein at least one wheel adjustably controls the position of the chamber to the surface.

12. The plurality of linked segmented chambers of claim 4 wherein the abrasive media dispersion chamber sprays pliant abrasive blast media that expands on the surface upon dispersion and is captured by the vacuum system.

13. The plurality of linked segmented chambers of claim 1 further comprising at least one oscillating nozzle or suction port oscillating at a different speed than another oscillating nozzle or suction port.

14. The plurality of linked segmented chambers of claim 1 wherein the apparatus is controlled by an operator.

15. The plurality of linked segmented chambers of claim 1 wherein the spray coating chamber comprises an orbiting spray head.

16. The plurality of linked segmented chambers of claim 8 wherein the stepper motor is programmable.

* * * * *